United States Patent
Ushijima et al.

(10) Patent No.: US 8,254,004 B2
(45) Date of Patent: Aug. 28, 2012

(54) OSCILLATOR AND OPTICAL DEFLECTOR HAVING OSCILLATOR

(75) Inventors: Takashi Ushijima, Nagoya (JP); Kaoru Noguchi, Tokyo (JP); Takahisa Kato, Tokyo (JP); Tomoyuki Kawano, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 402 days.

(21) Appl. No.: 12/523,122

(22) PCT Filed: Feb. 7, 2008

(86) PCT No.: PCT/JP2008/052478
§ 371 (c)(1),
(2), (4) Date: Jul. 14, 2009

(87) PCT Pub. No.: WO2008/096901
PCT Pub. Date: Aug. 14, 2008

(65) Prior Publication Data
US 2010/0002277 A1   Jan. 7, 2010

(30) Foreign Application Priority Data
Feb. 7, 2007   (JP) .............................. 2007-027786

(51) Int. Cl.
*G02B 26/08* (2006.01)
(52) U.S. Cl. ............... 359/199.1; 359/199.4; 359/200.8; 359/221.2
(58) Field of Classification Search .... 359/198.1–200.8, 359/213.1–215.1, 221.2–221.4
See application file for complete search history.

(56) References Cited

U.S. PATENT DOCUMENTS

| | | | | |
|---|---|---|---|---|
| 5,536,926 A | * | 7/1996 | Ikeda et al. | 235/462.25 |
| 5,994,160 A | * | 11/1999 | Niedermann et al. | 438/53 |
| 6,024,283 A | * | 2/2000 | Campanelli et al. | 235/462.32 |
| 6,062,476 A | * | 5/2000 | Stern et al. | 235/462.35 |
| 6,327,087 B1 | | 12/2001 | Hashimoto et al. | |
| 6,436,265 B1 | | 8/2002 | Shimada et al. | |
| 6,506,623 B2 | | 1/2003 | Teshima et al. | |
| 6,800,950 B2 | | 10/2004 | Teshima et al. | |
| 6,900,925 B2 | | 5/2005 | Kato et al. | |
| 7,038,834 B2 | | 5/2006 | Kato et al. | |
| 7,220,009 B2 | | 5/2007 | Shimada et al. | |
| 7,304,785 B2 | * | 12/2007 | Hagood et al. | 359/290 |
| 7,310,176 B2 | | 12/2007 | Kato et al. | |
| 7,423,795 B2 | | 9/2008 | Kato et al. | |

(Continued)

FOREIGN PATENT DOCUMENTS

EP   0 661 660 A2   7/1995

(Continued)

OTHER PUBLICATIONS

International Search Report issued in corresponding International Application No. PCT/JP2008/052478.

(Continued)

*Primary Examiner* — Frank Font
(74) *Attorney, Agent, or Firm* — Fitzpatrick Cella Harper & Scinto (57) ABSTRACT

An oscillating device includes an oscillator, an elastic supporting member for movably supporting the oscillator, a first supporting frame for supporting the elastic supporting member, and a second supporting frame extending along the elastic supporting member with a spacing maintained therebetween, the second supporting member extending from the first supporting frame, wherein the second supporting frame is provided in a cantilever shape relative to the first supporting frame.

10 Claims, 11 Drawing Sheets

U.S. PATENT DOCUMENTS

| | | |
|---|---|---|
| 7,446,920 B2 | 11/2008 | Kato et al. |
| 7,518,774 B2 | 4/2009 | Kato et al. |
| 7,612,569 B2 | 11/2009 | Ushijima et al. |
| 2003/0155841 A1* | 8/2003 | Tamura et al. ............ 310/307 |
| 2007/0279720 A1 | 12/2007 | Torashima et al. |
| 2009/0027748 A1* | 1/2009 | Sprague et al. ............ 359/199 |
| 2009/0135472 A1 | 5/2009 | Kato et al. |

FOREIGN PATENT DOCUMENTS

| | | |
|---|---|---|
| EP | 0 731 417 A2 | 9/1996 |
| EP | 0 766 060 A1 | 4/1997 |
| JP | 9-159938 | 6/1997 |
| JP | 9-179053 | 7/1997 |
| JP | 2005-70708 | 3/2004 |

OTHER PUBLICATIONS

Written Opinion of the International Searching Authority issued in International Application No. PCT/JP2008/052478.

* cited by examiner

Prior Art

FIG.11

Prior Art

OSCILLATOR AND OPTICAL DEFLECTOR HAVING OSCILLATOR

TECHNICAL FIELD

This invention relates to an oscillating device having a movable oscillator. In another aspect, the invention concerns an optical deflector having such oscillating device and adapted to be incorporated into a bar code scanner, a laser beam printer, a copying machine or a display unit, for example, and optical equipment such as an image forming apparatus or an image reading apparatus having such optical deflector.

BACKGROUND ART

In the marketplace of optical deflectors and image forming apparatuses or image reading apparatuses having an optical deflector, there is a strong demand that these should be produced smaller in size and more inexpensive in cost. For example, with regard to optical deflectors to be incorporated into laser beam printers or the like, attempts have been made to using a galvano mirror in substitution for a polygon mirror, to provide a small-size and low-cost optical deflector.

The polygon mirror, as its name suggests, is configured to deflect light by using a plurality of surfaces; whereas the galvano mirror is configured to deflect light by using a single surface thereof. Hence, with the use of the galvano mirror, image failure (e.g., stripe-shaped image spot called "banding") resulting from unevenness of angles defined by the surfaces with respect to the rotation axis, which sometimes occur when the polygon mirror is used, can be avoided.

Figure 10A:
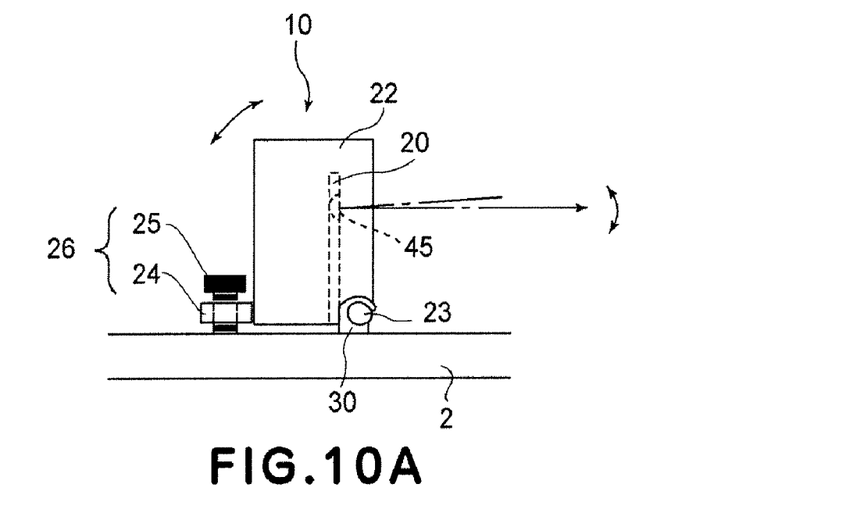
FIG. 10A and FIG. 10B are schematic diagrams for explaining another example of background art.
Figure 10B:
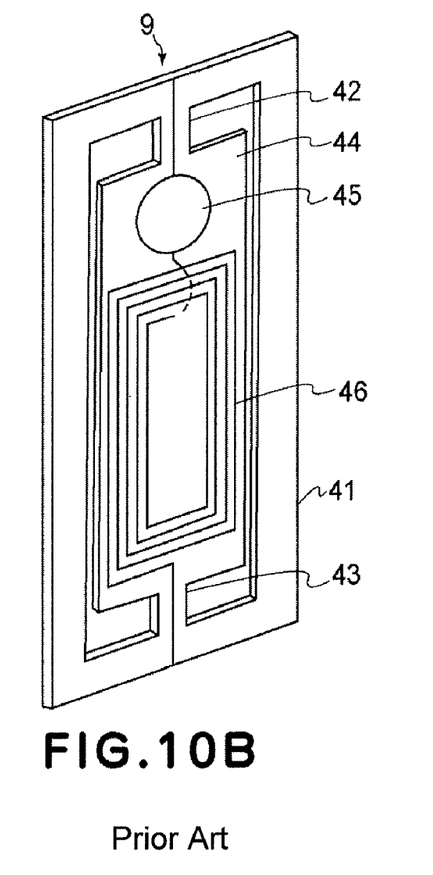

Referring to FIG. 10A and FIG. 10B, an example of background art in this field will be explained (see Japanese Laid-Open Patent Application No. 09-179053).

A deflector 10 shown in FIG. 10A comprises an optical deflecting device 20, a driving member for producing sinusoidal oscillation of the optical deflecting device 20, and a deflector housing 22. In this structure, at either end of the deflector housing 22 at the bottom of the reflection surface side in the direction perpendicular to the sheet of the drawing, a rotational shaft 23 of cylindrical shape which is formed integrally with the deflector housing 22 is mounted on a bearing 20 which is integrally molded with the housing 22. Furthermore, at the bottom of the back of the deflector housing 22, there is a tilt adjusting member 26 which comprises an adjusting screw mounting plate 24 and an adjusting screw 25. By rotating the adjusting screw 25, the amount of tilt of the deflector housing 22 can be adjusted. Therefore, the angle of the reflection surface of a reflecting mirror 45 of an oscillator 44 shown in FIG. 10B can be adjusted, and the laser beam can be reflected in a desired direction.

Here, the oscillating device 9 consists of an oscillator 44, elastic supporting members 42 and 43, and a supporting frame 41. The supporting frame 41 is configured to surround the oscillator 44. Mounted on the oscillator 44 is an electric coil 46 which constitutes a portion of driving means (actuator) for driving the oscillator.

Figure 11:
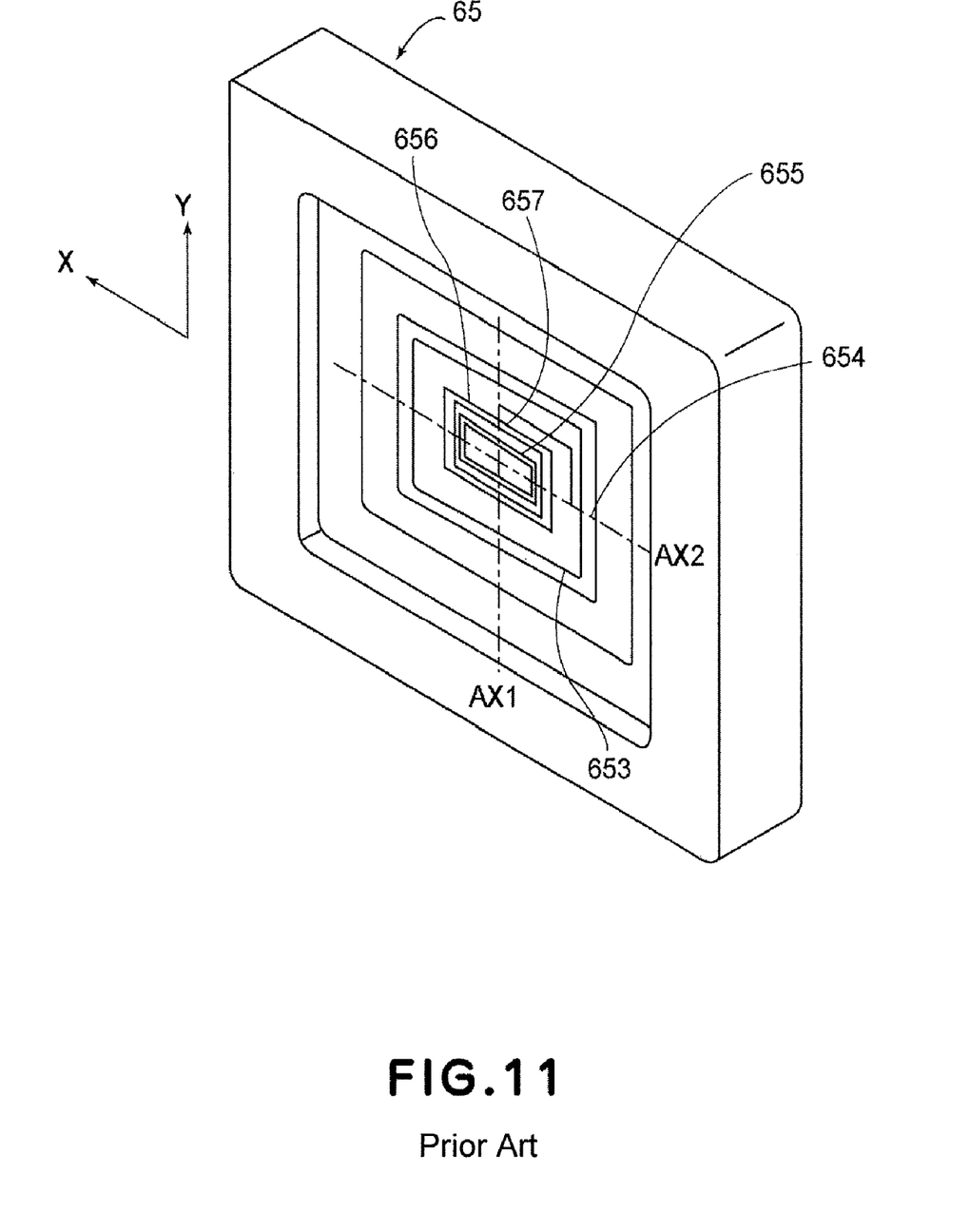
FIG. 11 is a schematic diagram for explaining a further example of background art.

Referring to FIG. 11, another example of background art will be explained (see Japanese Laid-Open Patent Application No. 2005-70708).

FIG. 11 shows a deflecting device 65 in which an inside movable plate 656 is oscillatingly and independently driven around a first axis AX1 and a second axis AX2 which are orthogonal to each other. The first axis AX1 is defined by an elastic supporting member 657 which supports the inside movable plate 656 relative to the outside movable plate 653 for oscillating motion. The second axis AX2 is defined by an elastic supporting member 654 which supports the outside movable plate 653 for oscillating motion. A mirror driving member including an electric coil 655 produces scanning deflection of the light beam in a main-scan direction X, by oscillating the inside movable plate 656 around the first axis AX1. On the other hand, the position in the sub-scan direction Y of the scanning light beam upon the surface to be scanned can be adjusted by oscillating the inside movable plate 656 around the second axis AX2. Thus, even if the scanning position of the light beam on the scan surface deviates in the sub-scan direction, the deviation can be well corrected, and the light beam can be scanningly deflected very accurately. In this example as well, the supporting frame is configured to surround the oscillator.

PATENT DOCUMENTS

No. 1: Japanese Laid-Open Patent Application No. 09-179053
No. 2: Japanese Laid-Open Patent Application No. 2005-70708

DISCLOSURE OF THE INVENTION

In the prior art examples described above, the supporting frame is configured to surround the oscillator. As a result, the oscillating device has to be large in size. This means that when, for example, the oscillating device is made from a silicon substrate such as one used in semiconductor processes, the number of oscillating devices obtainable from one piece of silicon substrate is inevitably small.

Furthermore, if size of the oscillating device is large, as compared with a case where the size is small, the number of products obtainable from a silicon substrate having a certain surface area becomes small. For example, it is now assumed that the number of products obtainable from a silicon substrate having a certain surface area, for large-size oscillating devices, is 1 (one) and, on the other hand, the number of products for small-size oscillating devices is 3 (three). In that occasion, only a small scratch on the silicon substrate will lead to unusableness of the whole substrate if the oscillating device size is large. On the other hand, if the device size is small, even though one product will be discarded in that occasion, the remaining two products will be usable. In this manner, the increase in size of the oscillating device undesirably results in an increase of the cost of the oscillating device in the point of the number of obtainable products and the yield of the manufacture.

Furthermore, it becomes necessary to enlarge the size of various components to meet the size of the oscillating device. This causes further increase of the image forming apparatus or image reading apparatus, in addition to the cost of the oscillating device.

In order to make the oscillating device smaller when the dimensions of the oscillator are already fixed by design, it may be a possible method to omit the supporting frame or to leave the supporting frame only in the vicinity of the elastic supporting member.

Figure 9A:
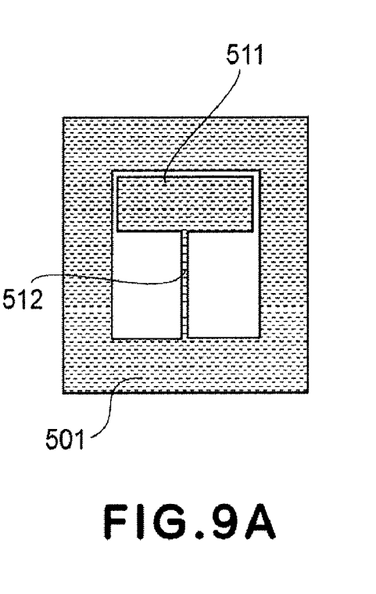
FIG. 9A-FIG. 9E are schematic diagrams for explaining an example of background art.
Figures 9B, 9C:
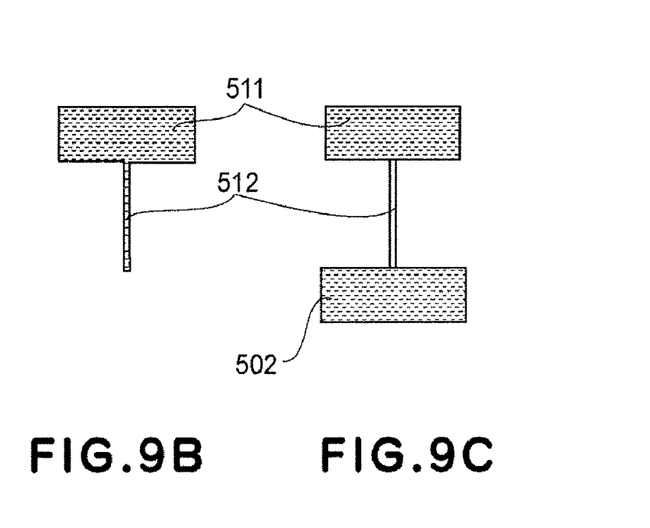

For example, in the case of an oscillating device having a supporting frame 501 which surrounds an oscillator 511 shown in FIG. 9A, the oscillating device may be made smaller if the supporting frame 502 has such structure as shown in FIG. 9B or FIG. 9C (there is substantially no supporting frame in the oscillating device of FIG. 9B). However, when these are attached to a fixing member, the following inconveniences will be caused during the assemblage.

Figures 9D, 9E:
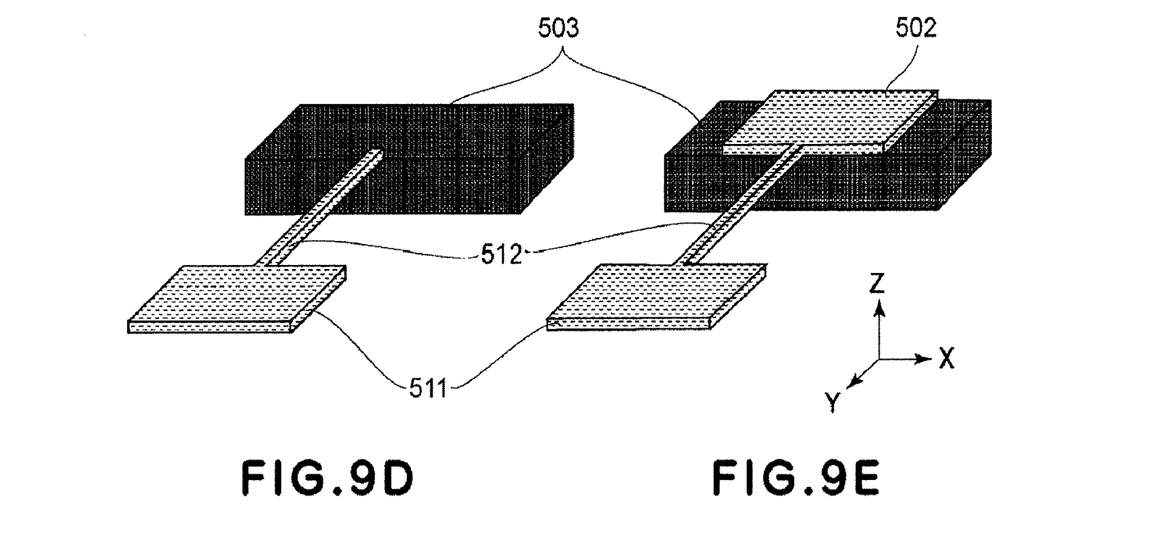

FIG. 9D and FIG. 9E are schematic diagrams showing the oscillating devices of FIG. 9B and FIG. 9C when they are attached to a fixing member 503. In FIG. 9D, an elastic supporting member 512 is directly fixed to the fixing member 503. In FIG. 9E, the supporting frame 502 is fixed to fixing member 503.

In the structures of FIG. 9D and FIG. 9E, there is nothing to prevent tilt or the like of the oscillating device in the Z-axis direction. As a result, during the process of assemblage, the oscillating device may tilt in the Z-axis direction due to the self-weight of the oscillator 511, or it may rotate about the Z-axis. This makes it difficult to mount and fix the oscillating device with good attitude precision. In the structure of FIG. 9E, in order to prevent tilt of the oscillating device in the Z-axis direction during the assemblage, the size of the supporting frame 502 may simply be enlarged. However, it inevitably results in enlargement in size of the oscillating device.

On the other hand, the elastic supporting member 512 or the supporting frame 502 may be held by certain means when the oscillating device is fixed to the fixing member 503. However, to this end, the elastic supporting member 512 or supporting frame 502 should have a sufficient surface area to hold the oscillating device. Furthermore, with this approach, it is very difficult to assure the mounting attitude precision of the oscillating device relative to the fixing member 503.

In accordance with an aspect of the present invention, there is provided an oscillating device, comprising: an oscillator; an elastic supporting member for movably supporting said oscillator; a first supporting frame for supporting said elastic supporting member; and a second supporting frame extending along said elastic supporting member with a spacing maintained therebetween, said second supporting member extending from said first supporting frame, wherein said second supporting frame is provided in a cantilever shape relative to said first supporting frame.

In accordance with another aspect of the present invention, there is provided an optical deflector, comprising: an oscillating device as recited above; an actuator for oscillating said oscillator of said oscillating device; and a fixing member for fixing said oscillating device, wherein said first supporting frame and said second supporting frame are held fixed by said fixing member.

In accordance with a further aspect of the present invention, there is provided an optical instrument, comprising: a light source; an imaging optical system; and an optical deflector as recited above, wherein said optical deflector deflects light from said light source, and the deflected light is incident on the surface to be irradiated, through said imaging optical system.

In accordance with a yet further aspect of the present invention, there is provided a method of fixing an oscillating device as recited above, on a fixing member, characterized in that, after the first and second supporting frames are held fixed on the fixing member, at least a portion of the second supporting frame is separated and removed.

Briefly, in accordance with the oscillating device of the present invention, since the second supporting frame extends along the elastic supporting member as described above, when the oscillating device is fixed to the fixing member while the first supporting frame and the second supporting frame are put on the fixing member, the mounting attitude can be established surely and precisely. Thus, the oscillating device can be easily fixed to the fixing member with good mounting attitude precision. Furthermore, since the second supporting frame extends along the elastic supporting member, the size of the oscillating device is not enlarged.

These and other objects, features and advantages of the present invention will become more apparent upon a consideration of the following description of the preferred embodiments of the present invention taken in conjunction with the accompanying drawings.

BEST MODE FOR PRACTICING THE INVENTION

Preferred embodiments of the present invention will now be described with reference to the attached drawings.

First Embodiment

Figure 1A:
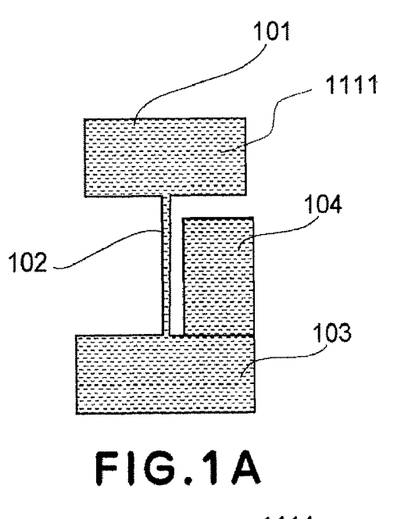
FIG. 1A and FIG. 1B and FIG. 1C and FIG. 1D are a top plan view and a perspective view, respectively, for explaining an oscillating device or an optical deflector according to a first embodiment of the present invention.
Figure 1B:
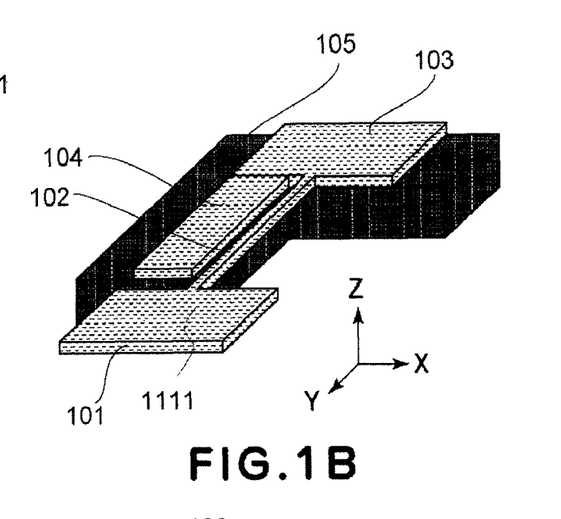

FIG. 1A and FIG. 1B are schematic diagrams for explaining a first embodiment of an oscillating device according to the present invention. FIG. 1B is a perspective view of the oscillating device of FIG. 1A, when the same is fixed to a fixing member 105. The oscillating device of the present embodiment comprises an oscillator 101, a beam-shaped elastic supporting member 102, a first supporting frame 103 and a second supporting frame 104. The second supporting frame 104 extends from the first supporting frame 103, and it elongates along the beam-shaped elastic supporting member 102 with a spacing interposed therebetween. In this embodiment the side edge of the second supporting frame 104 close to the elastic supporting member 102 extends in parallel to the direction of elongation of the elastic supporting member 102.

The second supporting frame 104 terminates at a position which is spaced from the oscillator 101 by an appropriate distance. Thus, the second supporting frame 104 has a cantilever structure affixed to the first supporting frame 103. The first supporting frame 103 and the second supporting frame 104 generally have an L shape, and the fixing member 105 has an L shape to meet this. It should be noted that, although in FIG. 1A and FIG. 1B a border line is shown between the first supporting frame 103 and the second supporting frame 104, this is merely to clarify the extension of each supporting frame. It does not mean the presence of any physical groove or the like, unless mentioned otherwise.

If the oscillating device of the present embodiment is produced based on semiconductor process, the oscillator 101, elastic supporting member 102, first supporting frame 103 and second supporting frame 104 are made integrally. For example, where Si is used as a base material and the oscillating device is produced made by processing the same, the aforementioned components are produced integrally from Si. Particularly, since monocrystal silicon is generally superior in mechanical properties, it can be suitably used as a material for the oscillator or the elastic supporting member. Furthermore, when the semiconductor process is used, it enables high-precision production of oscillating devices. Additionally, use of the semiconductor process makes it possible to produce a device for detecting the amount of torsion of the elastic supporting member 102 or any change of torsion of the same, based on the semiconductor process.

With regard to materials other than silicon, metal materials may be used, for example, in place of Si. If a metal material is used, the oscillating device can be produced by pressing.

As regards the detection of the quantity of torsion of the elastic supporting member, it can be detected, for example, by providing piezoresistance sensor in a portion of the elastic supporting member. Furthermore, if a permanent magnet and an electromagnetic coil to be described below are used as an actuator for driving the oscillator, the detection can be realized based on the induced electromotive force, induced in the electromagnetic coil by any relative positional change between them. As an alternative, electrodes may be formed on both of the oscillator and a member (e.g., second supporting frame 103) whose relative position with respect to the oscillator is changeable, to thereby form a capacitor. The detection can be made based on a change of capacitance of the capacitor due to displacement of the oscillator.

In the structure described above, if the oscillator 101 is used as a mirror 1111, preferably it should have good light reflection performance. To this end, a reflecting metal film may be formed on the oscillator as required and, furthermore, an oxide film may be formed as a reflection enhancement coating. For example, a laminated film comprising aluminum for the metal film and $TiO_2$ or $SiO_2$ for the oxide film, may be used.

In that case, depending on the film forming method (e.g., sputtering method, EB evaporation method or resistance heating method), a metal film or oxide film may be formed on the elastic supporting member, the first supporting frame, second supporting frame or the like, in addition to the oscillator. When a metal film or oxide film is formed on the entire surface of the oscillating device as described above, it may cause a problem of stress of the film. To solve the problem, a film forming method effective to reduce the stress may be used or, alternatively, the surfaces at either side of the oscillating device may be provided with the same film to cancel the stress. As a further alternative, an intermittent film (islet-like films are distributed) may be used in place of a continuous film.

In this embodiment as shown in FIG. 1A and FIG. 1B, the second supporting frame 104 extends along the elastic supporting member 102, and the fixing member 105 is formed to have a shape corresponding to the combined shape of the first and second supporting frames 103 and 104. With this structure, when the oscillating device is attached to the fixing member 105, the oscillating device can be mounted on the fixing member 105 with high mounting precision just by putting the first supporting frame 103 and the second supporting frame 104 on the predetermined portion of the fixing member 105. The oscillating device can be fixed afterwards. Thus, the size is not enlarged regardless of the addition of the second supporting frame 104, and an oscillating device of small in size but having high mounting precision to the fixing member 105 can be produced.

More specifically, by putting the second supporting frame 104 on the fixing member 105 as shown in FIG. 1B, tilt or the like of the oscillator 101 and the elastic supporting member 102 in the Z-axis direction can be prevented. After the mounting, the first supporting frame 103 and the second supporting frame 104 may be fixed, over the whole surface, to the fixing member 105 by using an adhesive agent. However, the adhesive may be used only at several points so that the remaining portion may be simply supported by the fixing member 105. In that occasion, the fixing member may be provided with protrusions at several points thereof, having flat top faces to define a single plane, so that the oscillating device can be fixed at these positions to the fixing member 105 by using an adhesive. More preferably, the oscillating device may be fixed at three points which easily define a single plane.

The fixing points may be set at any locations provided that high mounting precision is assured thereby. These may be defined only within the region of the first supporting frame 103, or they may be set in the region including the first supporting frame 103 and the second supporting frame 104.

In the former case, after having fixed the oscillating device to the fixing member 105, a portion of the second supporting frame 104 may be removed by cutting. In that occasion, a physical linear cut may be formed beforehand along the boundary between the first and second supporting frames 103 and 104 as shown at a line in FIG. 1A, and the second supporting frame 104 may be folded there and separated. Alternatively, it may be separated by using a laser beam or it may be cut by suing a blade. As regards the cutting position, any positions except the fixing points may be chosen unless the mounting attitude becomes unstable. By the separation described above, a zone which is available for any other purpose is produced on the fixing member 105. In that case, when the second supporting frame is separated, a portion of the fixing member may be separated together. It is possible that the presence of the fixing member of the second supporting frame in the vicinity of the oscillator advantageously works or disadvantageously works in dependence upon the driving characteristic of the oscillator or the driving method therefor. This is because the oscillator is influenced by the air if the ambience of the oscillator when the same is driven is not a vacuum ambience. If the fixing member or the second supporting frame has an influence on the pneumatic flow, they may be left there or removed as required.

Figure 1C:
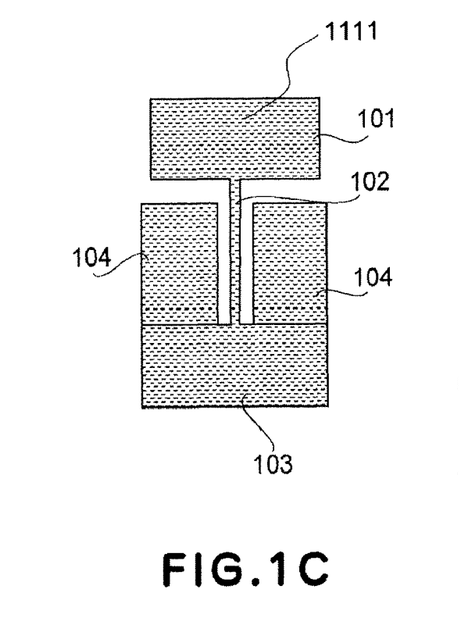
Figure 1D:
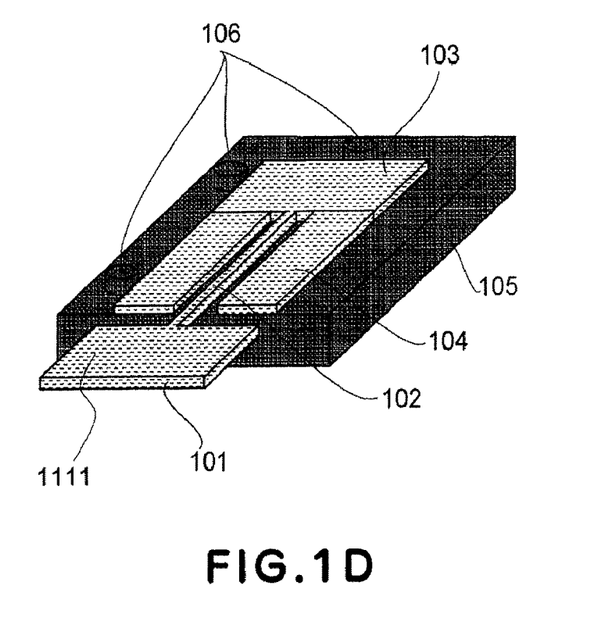

The structure of the oscillating device described above may be modified as follows. As shown in FIG. 1C, a plurality of second supporting frames 104 (two in the illustrated example) may be provided to sandwich the elastic supporting member 102 therebetween. Here, the second supporting frames 104 are supported by the fixing member 105 (FIG. 1D). As shown in FIG. 1C and FIG. 1D, with the provision of the second supporting frames 104 on either side of the elastic supporting member 102, fixation of the oscillating device to the fixing member 105 while the former is tilted in the Z-axis direction can be avoided more assuredly, without enlarging the size of the oscillating device.

In this case, based on the relationship between the state of surface unevenness of the fixing member 105 and the supporting frames 103 and 104 and the length of the second supporting frame 104, the mounting precision of the oscillating device can be controlled. It is less affected by the surface unevenness of the fixing member or the supporting frame if the second supporting frame 104 extends more along the elastic supporting member 102, and hence the oscillating device can be fixed to the fixing member 105 more precisely. Furthermore, as shown in FIG. 1D, a single protrusion or plural protrusions 106 may be provided on the surface of the fixing member 105 where the oscillating device is going to be mounted. By engaging the first supporting frame 103 and the second supporting frame 104 against the protrusions, movement of the oscillating device during the fixation can be restricted. Furthermore, this ensures that, relative to the fixing member 105, the oscillating device is fixed exactly at a predetermined position. Hence, rotation of the oscillating device about the Z-axis or deviation of the same in the X-axis direction or Y-axis direction can be prevent, and thus the oscillating device can be fixed to the fixing member 105 more precisely.

Now, in order to assure that the oscillating device is easily mounted to the fixing member at high mounting precision, it is desirable that, when the first supporting frame 103 and the second supporting frame 104 are put on a predetermined portion of the fixing member, the oscillating device automatically takes a predetermined attitude. To this end, it is preferable that the second supporting frame 104 is placed close to the elastic supporting member 102 as much as possible but without contact thereto, and that the second supporting frame extends as long as possible. Furthermore, it is desirable that the centroid of the oscillating device is placed within the region of the first supporting frame 103 or second supporting frame 104 or between two second supporting frames 104. Once it is assured that the oscillating device is stably mounted only by putting the same on the fixing member, inconveniences such as breakage of the oscillating device due to overloading thereto when the same is mounted, or gradual shift of the same from the fixing member when it is used, can be avoided.

As regards the manner of elongation, it is not always necessary that the elastic supporting member 102 and the side edge of the second supporting frame 104 are parallel to each other as shown in FIG. 1. For example, the side edge of the second supporting frame 104 may be tapered so as to be gradually spaced apart from the elastic supporting member 102 or to be gradually nearing the same. In the latter case, the connection between the first supporting frame 103 and the second supporting frame 104 can be made relatively short. Therefore, if the second supporting frame is to be separated after the fixation as described hereinbefore, the separation can be made easily.

Furthermore, the positional relationship between the free end of the second supporting frame and the oscillator 101 can be set in various ways. For example, in some cases the free end had better be appropriately spaced from the oscillator 101 to avoid an increase of the air resistance when the oscillator 101 is oscillated. In those cases, as an example, the side edge of the second supporting frame 104 may be tapered so as to be gradually separated from the elastic supporting member 102, such that a relatively large space is defined between the free end of the second supporting frame 104 and the oscillator 101.

Figure 7:
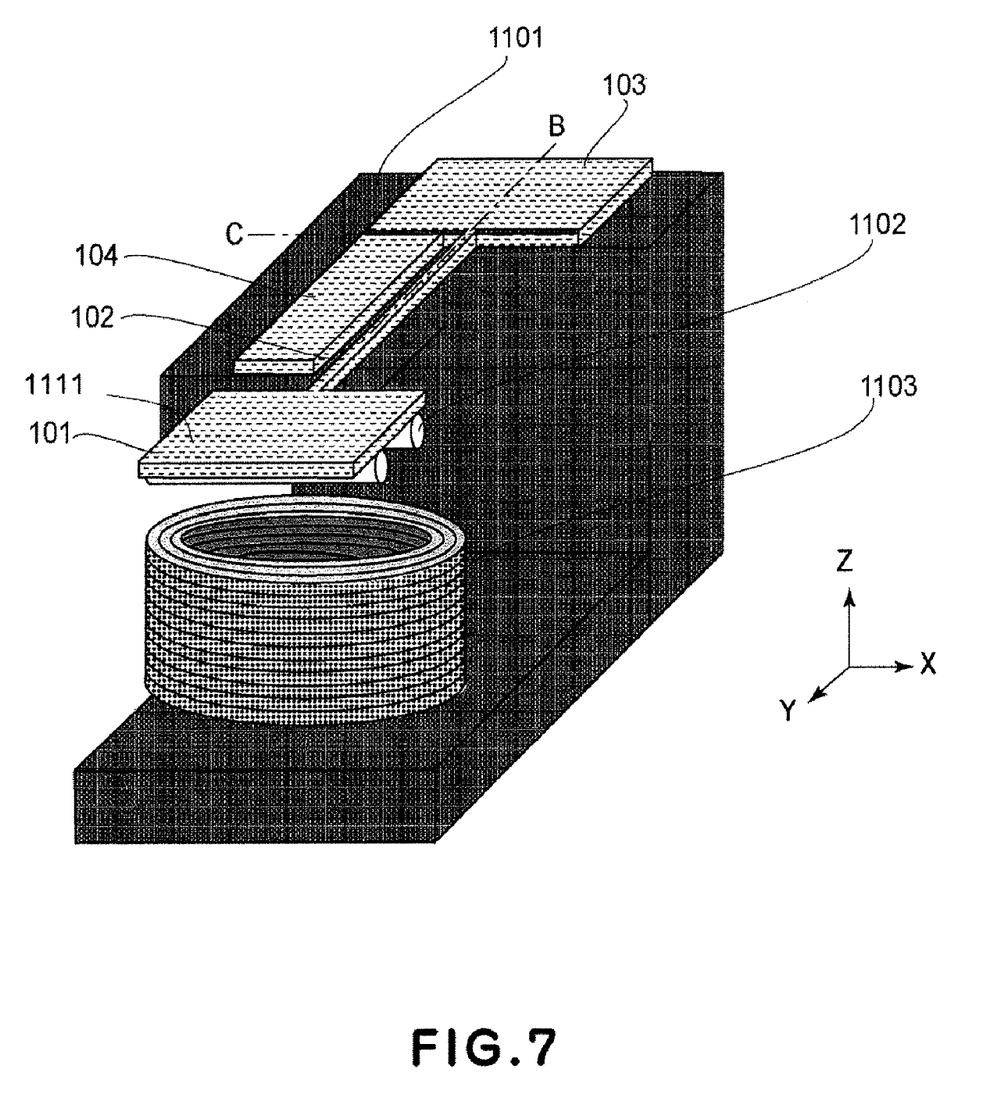
FIG. 7 is a perspective view for explaining an actuator of an oscillating device of the present invention.

Now, an actuator (oscillation power source) which generates a force for producing oscillation of the oscillator 101 will be explained. FIG. 7 illustrates an actuator which is comprised of an oscillating device having two permanent magnets 1102 of columnar shape (the number may be other than two), being mounted on the bottom surface of the mirror surface of the oscillator 101 shown in FIG. 1A. The oscillating device is fixed to the fixing member 1101 having an electromagnetic coil 1103. Here, the permanent magnets 1102 are being magnetized longitudinally. Although not shown in the drawing, a drive processing circuit connected to the electromagnetic coil 1103 may be added to this structure as required, to constitute an optical deflector.

When an electric current is applied to the electromagnetic coil 1103 in the actuator described above, a magnetic field is produced and, due to interaction between the magnetic field and the permanent magnet 1102, an attraction force and a repulsive force are produced. Based on this, the oscillator 101 is torsionally oscillated about an axis (broken line B in FIG. 7) which is defined by the elastic supporting member 102. Here, if the electromagnetic coil 1103 is configured to produce a magnetic field at the same period as the as the natural oscillation frequency of the elastic supporting member 102 or a period which is N times or 1/N times of that period, the elastic supporting member 102 can be torsionally oscillated in a resonance mode. An electromagnetic coil may be provided on the oscillator, and the disposition relationship of the electromagnetic coil and the permanent magnet may be reversed.

Furthermore, as regards the force for producing oscillation, it is not limited to use of electromagnetic force. For example, electrodes may be provided on the oscillator and on a stationary side opposed to this, so that the oscillator may be oscillated based on the electrostatic attraction force. Furthermore, a piezoelectric device may be provided on the fixing member or, alternatively, deformation of SMA (shape memory alloy) mounted on the fixing member due to heat (the heat may be produced by applying a modulation current to a heater mounted on the SMA) may be used to cause oscillation of the oscillator.

As a further alternative, the oscillator 101 may be oscillated around an oscillation axis (broken line in FIG. 7) which is perpendicular to the axis B. In that case, the elastic supporting member 102 functions as a spring which produces flexure oscillation, rather than a spring which causes torsional oscillation. As an actuator in that case as well, the electromagnetic driving method which is based on an electromagnetic coil and a permanent magnet (being magnetized in a direction perpendicular to the surface of the oscillator), an electrostatic driving method or a piezoelectric driving method may be used.

In the structure described above, the mirror surface may be provided on one side of oscillator 101, or it may be provided on either side thereof. If either side are used as a mirror surface, as an example an oscillation power source such as a permanent magnets may be provided at either one of the Y axis direction of the oscillator, to secure the mirror surface. The mirror surfaces at either side may be used for deflection of multiple light beams for the image formation, for example. On the other hand, one may be used for the deflection of a beam for image formation, while the other may be used for the deflection of a beam to be directed to a detector for detecting the state of oscillation of the oscillator.

The oscillating device of the structure described above may be used in any devices other than an optical deflector. For example, it can be used in various physical quantity sensors such as acceleration sensors or electric potential sensors. In these cases, no mirror is formed on the oscillator, but an electrode for displacement detection of the oscillator or an electrode for detection of an electric potential of an object to be measured may be provided there. In summary, the oscillating device of the present invention may be used in any instruments which include an oscillator that should be mounted with an accurate attitude.

In accordance with the present embodiment having been explained above, an oscillating device which is small in size and inexpensive in cost and which has high mounting precision is accomplished. Furthermore, devices such as optical deflectors comprising an oscillating device can be provided. Additionally, since the supporting frame is formed to extend along the elastic supporting member, there is an advantageous feature that, relative to impact during or after the mounting, the supporting frame protects the elastic supporting member.

Second Embodiment

Figure 2A:
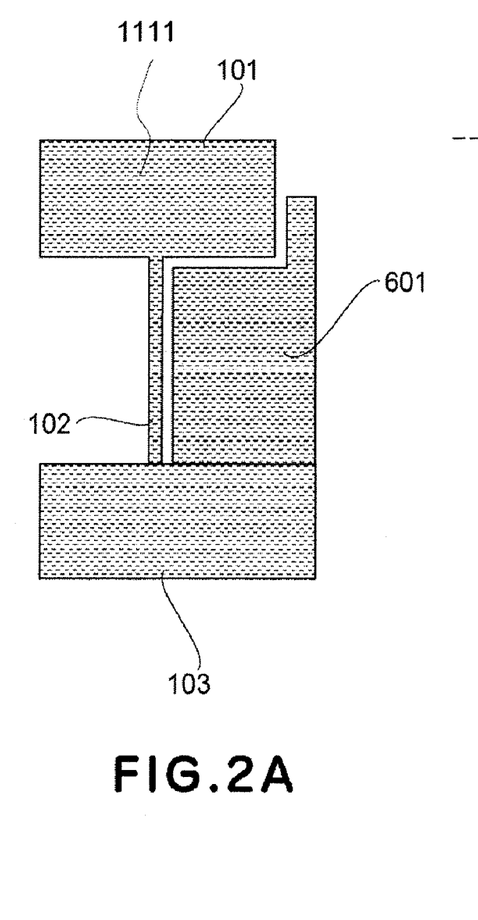
FIG. 2A and FIG. 2B are top plan views, respectively, for explaining an oscillating device according to a second embodiment of the present invention.
Figure 2B:
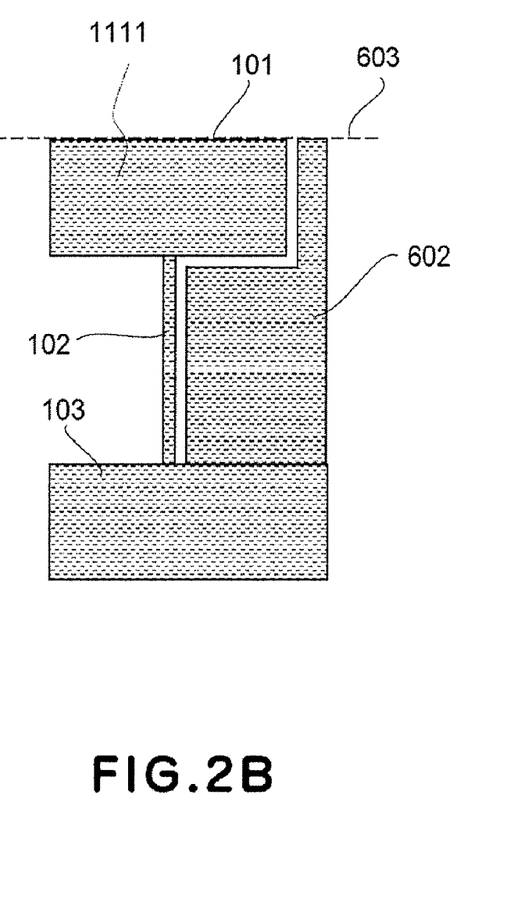

Referring to FIG. 2A and FIG. 2B, a second embodiment of the present invention will be explained. In the second embodiment shown in FIG. 2A and FIG. 2B, the side edges of the second supporting frames 601 and 602 extend along the elastic supporting member 102 and the oscillator 101. As described hereinbefore, the longer the second supporting frame is, the more the tilt of the oscillator 101 and the elastic supporting member 102 in the Z-axis direction is reduced. In the structure of the present embodiment, since the second supporting frames 601 and 602 extend up to the oscillator 101, tilt of the same in the Z-axis direction can be reduced furthermore. Furthermore, the mounting precision is less influenced by the surface unevenness of the fixing member and the supporting frame.

Furthermore, in the structure shown in FIG. 2B, the oscillator 101 and the free end of the second supporting frame 602 coincide with each other at the position of a broken line 603. Therefore, when an oscillating device is cut out of a base material, the oscillator 101 and the free end of the second supporting frame 602 can be cut simultaneously to facilitate the manufacture. The remaining features are essentially the same as the first embodiment.

Third Embodiment

Referring to FIG. 3A-FIG. 3D, a third embodiment of the present invention will be explained. In the third embodiment shown in FIG. 3A and FIG. 3B, the side edge of the second supporting frame 701 which extends in parallel to the elastic supporting member 102 and which is far remote from the elastic supporting member 102, is on the same line 702 as the side edge of the oscillator 101.

Figure 3A:
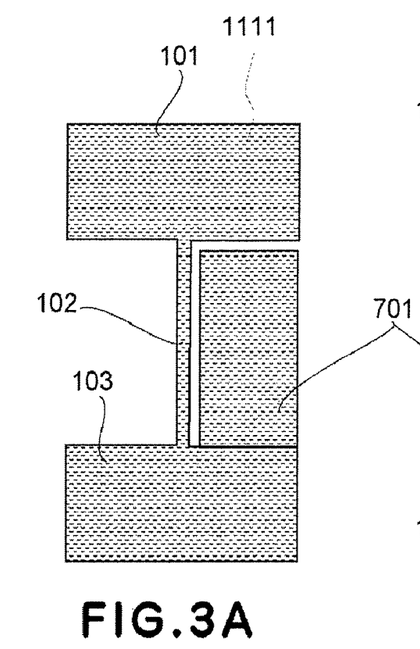
FIG. 3A-FIG. 3D are top plan views, respectively, for explaining an oscillating device according to a third embodiment of the present invention.
Figure 3B:
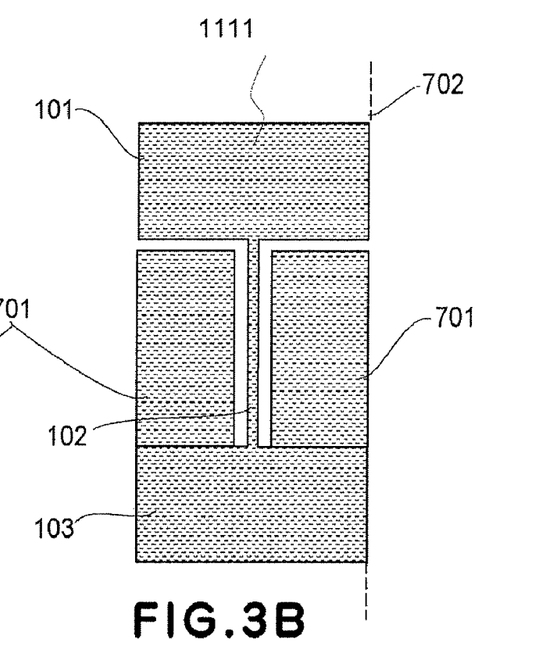
Figure 3C:
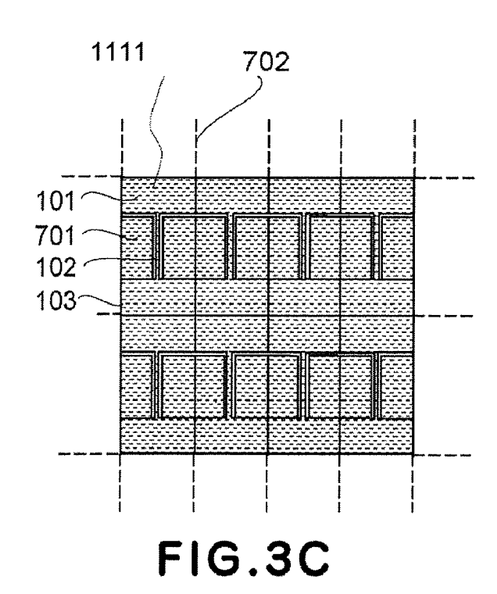

In the structure of the present embodiment as described above, when the oscillating device is cut out of a base material, the oscillator 101 and the side edge of the second supporting frame 701 can be cut at once, to facilitate the manufacture. FIG. 3C illustrates the position of the line 702 when oscillating devices are cut out of the base material.

Figure 3D:
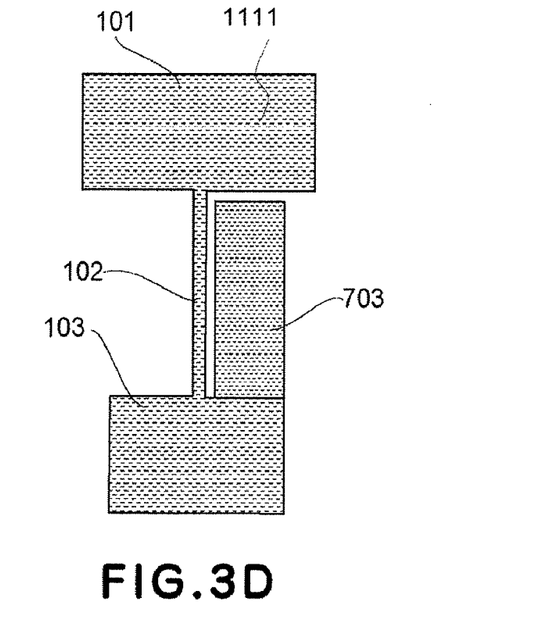

FIG. 3D illustrates a modified example. Here, the side edge of the second supporting frame 703 which extends in parallel to the elastic supporting member 102 and which is far remote from the elastic supporting member 102, is closer to the elastic supporting member than the side edge of the oscillator 101 is. In this case, there is no necessity of cutting the second supporting frame 703 which is produced by etching the base material. The remaining features of the present embodiment are similar to the first embodiment.

Fourth Embodiment

Figure 4A:
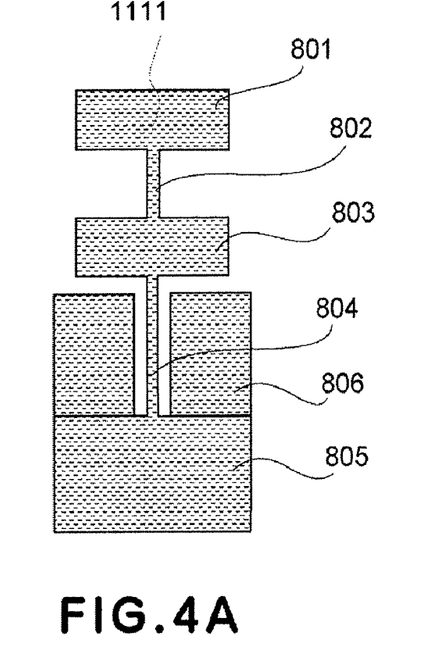
FIG. 4A-FIG. 4C are top plan views, respectively, for explaining oscillating devices according to fourth and fifth embodiments of the present invention.

Referring to FIG. 4A-FIG. 4C, a fourth embodiment of the present invention will be explained. The fourth embodiment shown in FIG. 4A comprises a first oscillator 801, a first elastic member 802, a second oscillator 803 and a second elastic supporting member 804. The second elastic supporting member 804 is supported by the first supporting frame 805. The first supporting frame 805 comprises a second supporting frame 806 of cantilever shape. The oscillation power source is configured to apply a driving force to the first oscillator 801 or the second oscillator 803.

The oscillating device the optical deflector according to the present embodiment comprises a plurality of elastic supporting members. Therefore, the first oscillator 801 can be torsionally oscillated based on the superposed torsional oscillation modes of the respective elastic supporting members. For example, if the first and second elastic supporting members 801 and 804 are so designed that the frequencies of the torsional oscillations of them are in the relationship of 2:1, the first oscillator 801 can be oscillated in accordance with sawtooth-wave oscillation. With such sawtooth-wave oscillation, drift of the oscillatory angular speed can be reduced. Therefore, deformation of the first oscillator 801 can be controlled, and thus the shape of the reflection spot reflectively deflected by the first oscillator 801 can be uniformed.

In this embodiment, if the first and second elastic supporting members 802 and 804 are so designed that the frequencies of the torsional oscillations of them are in the relationship of 3:1, roof-shape-wave oscillation is obtainable. In this case as well, drift of the angular speed is reduced. Thus, deformation of the first oscillator 801 is suppressed and the shape of the reflection spot is uniformed.

In the structure described above, since the second oscillator 803 and first oscillator 801 are formed, the oscillators and the elastic supporting members are more liable to tilt in the Z-axis direction. This is because there are more components of the oscillating portion of the oscillating device and the length is prolonged and because the centroid of the oscillating device tends to be spaced away from the first supporting frame 805. Therefore, it is desirable to bring the centroid of the oscillating device close to the first supporting frame 805 or second supporting frame 806. To this end, for example, the size of the first supporting frame 805 may preferably be enlarged or the second supporting frame 806 may be enlarged or prolonged. For example, the centroid may be placed between the first supporting frame 805 or second supporting frame 806 or two second supporting frames 806. With this structure, when the oscillating device is put on the fixing member, tilt of the first oscillator 801 and second oscillator 803 and the elastic supporting member 802 and 804 in the Z-axis direction can be prevented assuredly.

Although the foregoing description has been made with regard to the preferable position of the centroid, if an adhesive is interposed between the oscillating device and the fixing member, the position is not limited to what described above. Even with the adhesive before it is set, an advantageous effect of preventing tilt of the oscillator and elastic supporting member in the Z-axis direction due to the surface tension or adhesiveness of the adhesive will be available to some extent.

In this embodiment, with the provision of the oscillation power source in the second oscillator 803, one side or both sides of the first oscillator 801 can be entirely used as a mirror 1111 surface.

Figure 4B:
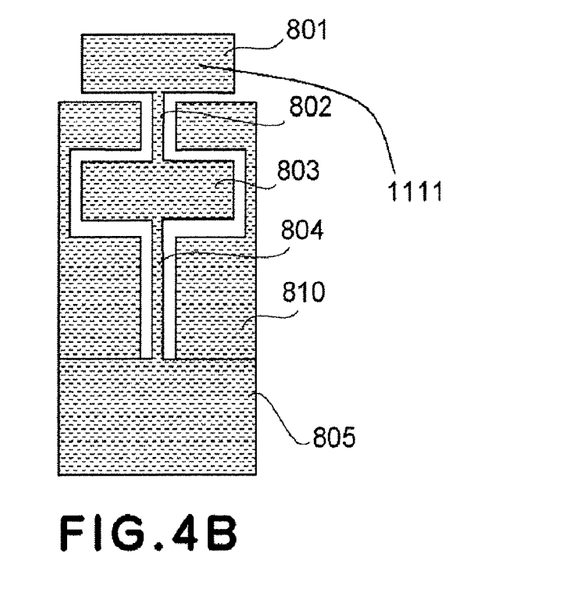

In the structure described above, the second supporting frame 810 may be extended up to the first elastic supporting member 802 as shown in FIG. 4B. With this arrangement, when the oscillating device is put on the fixing member, tilt of the oscillators 801 and 803 and the elastic supporting members 802 and 804 in the Z-axis direction can be prevented more assuredly. The remaining features of the present embodiment are similar to the first embodiment.

Fifth Embodiment

Figure 4C:
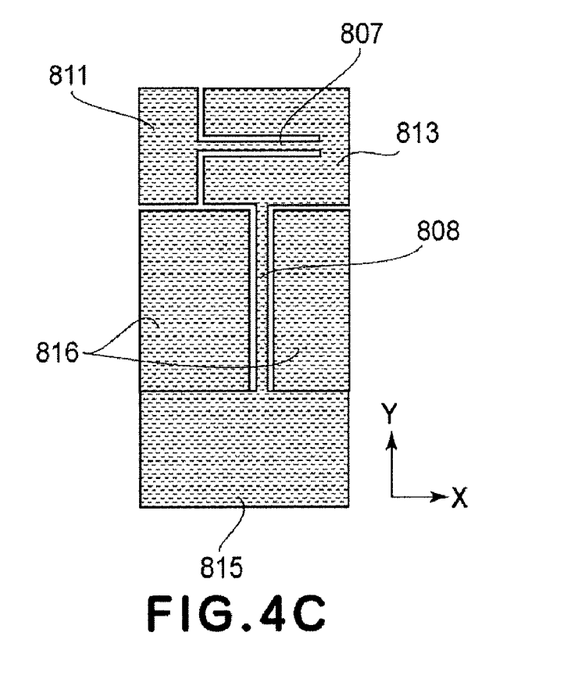

FIG. 4C shows an oscillating device for use in a two-dimensional scanner, according to a fifth embodiment of the present invention. In this embodiment, the oscillating device comprises a second elastic supporting member 808 and a first elastic supporting member 807 which is in an orthogonal relation with the second elastic supporting member 808. There are second supporting frames 816 which extend along either side of the second elastic supporting member 808, and a second oscillator 813 is supported for oscillating motion relative to a first supporting frame 815, by means of the second elastic supporting member 808. Furthermore, a first oscillator 811 is supported for oscillating motion relative to the second oscillator 813, by means of the first elastic supporting member 807.

Even in such structure, the second supporting frame 816 according to the concept of the present invention can be provided in cantilever shape relative to the first supporting frame 815, and advantageous results having been described with reference to the preceding embodiment are attainable. As described above, the second supporting frame based on the concept of the present invention can used effectively even in an oscillating device which comprises a plurality of oscillators (first oscillator 811 and second oscillator 813) having different oscillation directions.

In this structure, the second elastic supporting member 808 torsionally oscillates about the Y-axis, while the first elastic supporting member 807 torsionally oscillates about the X-axis, by which two-dimensional scan of a light beam reflected by the first oscillator 811 is realized. In this case, it is desirable that the first oscillator 811 and the second elastic supporting member 808 are aligned with each other along the same straight line. With this arrangement, it is assured that the first oscillator 811 performs two-dimensional scan about the portion where the centroid of the first oscillator 811 will be present. The remaining features of the present embodiment are similar to the first embodiment.

Sixth Embodiment

Figure 5A:
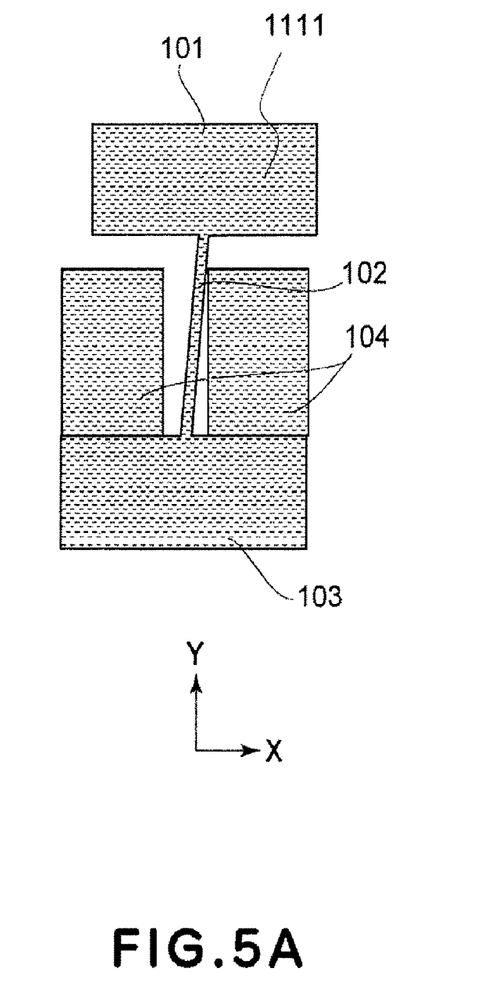
FIG. 5A and FIG. 5B are top plan views, respectively, for explaining an oscillating device according to a sixth embodiment of the present invention.

Referring to FIG. 5A and FIG. 5B, a sixth embodiment of the present invention will be explained. FIG. 5A is a schematic diagram showing the state that an impact or contact force is applied to an oscillator 101 or an elastic supporting member 102 of an oscillating device similar to that of the first embodiment and that these elements are deformed or displaced in the X-axis direction. In this embodiment, there is a second supporting frame 104 which extends along the elastic supporting member 102, by which the amount of displacement of the elastic supporting member 102 and the oscillator 101 is restricted. Hence, the application of a large stress to the elastic supporting member 102 which may cause breakage of the same can be prevented. To this end, the side edge of the second supporting frame 104 should effectively made close to the elastic supporting member 102, within the limit not interfering the operation.

Figure 5B:
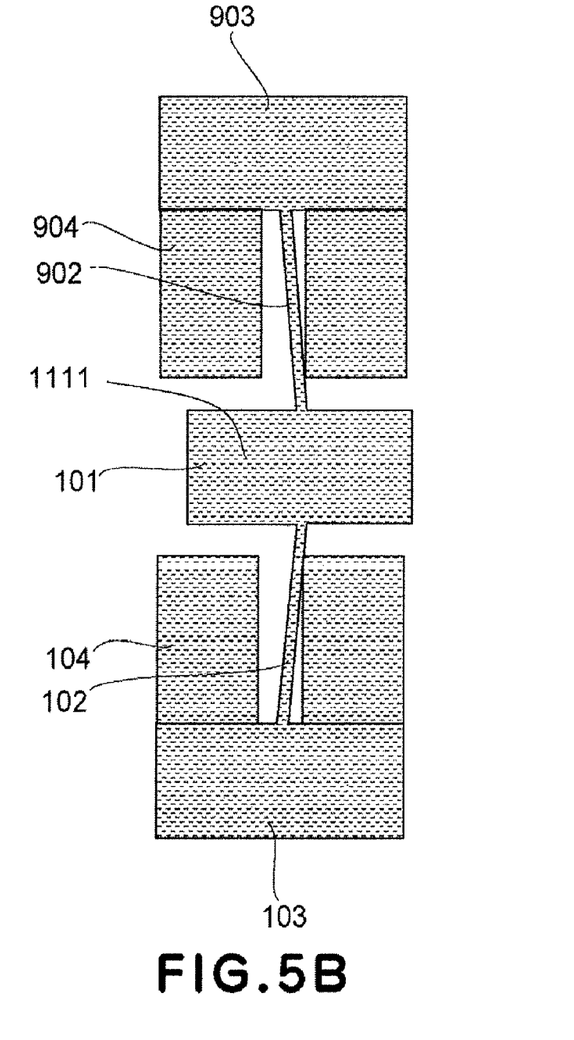

The aforementioned advantageous results are effectively attainable also with the arrangement that the structures each being shown in FIG. 5A are provided symmetrically on either side of the oscillator 101, as shown in FIG. 5B. In FIG. 5B, the oscillator 101 is supported by plural (two in the illustrated example) elastic supporting members 102 and 902. The elastic supporting member 902 as well supports the oscillator 101 for oscillating motion relative to another first supporting frame 903. There is another second supporting frame 904 which is provided in cantilever shape relative to the first supporting frame 903. The function of these second supporting frames is the same as described hereinbefore.

In this manner, the second supporting frame according to the concept of the present invention can be effectively used even in an oscillating device wherein a single oscillator is supported by a plurality of elastic supporting members. The remaining features of the present embodiment are similar to the first embodiment.

Seventh Embodiment

Referring to FIG. 6-FIG. 6E, a seventh embodiment of the present invention will be explained. The oscillating device of the present embodiment comprises a structure similar to that shown in FIG. 1C. FIG. 6B and FIG. 6C are enlarged sectional views of a portion inside the circle of FIG. 6A, taken along a line A-A, and these show an example wherein the processed shape of a component such as the elastic supporting member 102 or the like of the oscillating device is based on perpendicular processing.

When the oscillating device is made from a silicon substrate as described hereinbefore, such structure is obtainable by forming an etching masking layer on the surface of a silicon substrate and by processing the same based on RIE (reactive ion etching).

Now, the width of the elastic supporting member 102 is denoted by w, the height is denoted by h, the gap with the second supporting frame 104 is denoted by g, the torsion angle is denoted by θ (deg.), and the apparent spring width provided by the torsion is denoted by a. Then, in the structure described above, the following condition (1) should be satisfied to ensure that the elastic supporting member 102 is kept out of contact with the second supporting frame 104.

$$2g+w > w \cdot \cos\theta + h \cdot \sin\theta = a \quad (1)$$

Figure 6A:
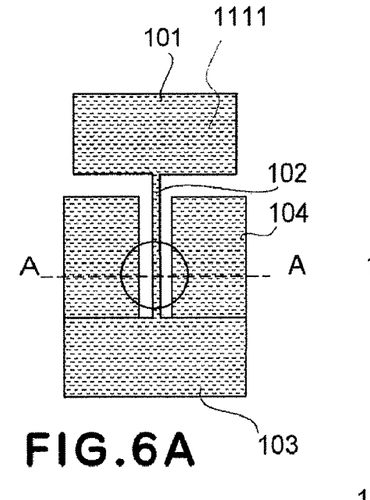
FIG. 6A-FIG. 6E are a top plan view and sectional views, respectively, for explaining an oscillating device according to a seventh embodiment of the present invention.
Figure 6B:
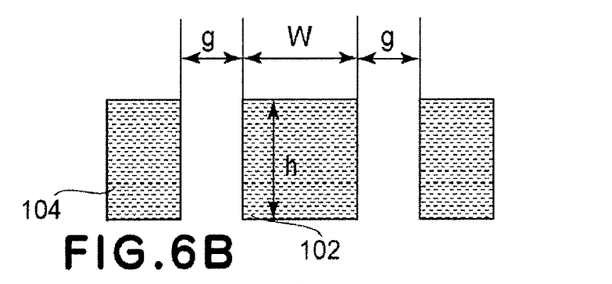
Figure 6C:
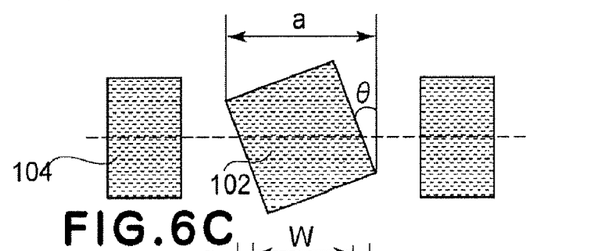
Figure 6D:
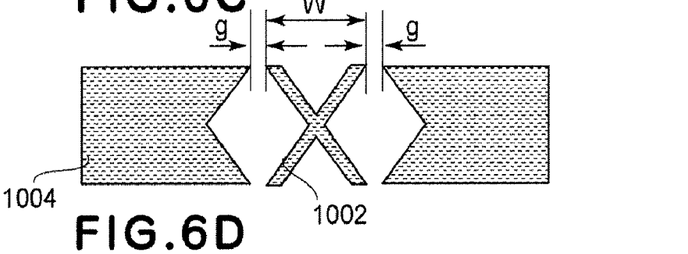
Figure 6E:
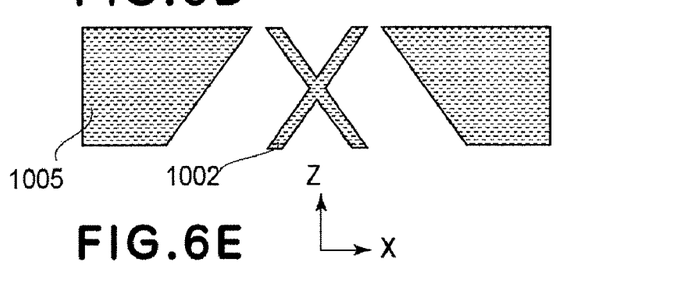

Next, a case where the processed shape of the oscillating device is obtainable by crystal anisotropy etching (e.g., etching of a monocrystal silicon substrate based on a TMAH water solution or KOH water solution) such as shown in FIG. 6D or FIG. 6E, will be described. Where crystal anisotropy etching is used, first of all, the elastic supporting member 1002 can be processed to have an X-section cross-sectional shape such as shown in FIG. 6E or FIG. 6E. As a result of this, the elastic supporting member 1002 becomes easy to be twisted but hard to be flexed in the X-direction or Z-direction. Furthermore, the isolation of frequencies of different oscillation modes becomes easy to do. As a result, the resonance operation in a desired mode can be accomplished stably and with good controllability.

Furthermore, the surfaces of the second supporting frames 1004 and 1005 opposed to the torsional oscillation spring 1002 can be formed with a V-groove shape or tapered shape as shown in FIG. 6D or FIG. 6E. In such structure, even if the value a increases in accordance with the torsion angle θ in equation (1), the value of g can be kept small since the torsional oscillation spring 1002 is hard to conflict with the second supporting frame.

In this manner, in the structural examples of FIG. 6D and FIG. 6E, the second supporting frame can be made larger, and it can be made much closer to the elastic supporting member. Thus, the setting precision of the oscillating device relative to the fixing member is improved, and deformation of the elastic supporting member due to any impact or the like, as has been described with reference to FIG. 5, can be restricted furthermore.

The present embodiment specifies the cross-sectional shape of the elastic supporting member 102 as well as the gap setting between the elastic supporting member 102 and the second supporting frame 104, in the structure of the first embodiment. The remaining features are similar to the first embodiment.

Eighth Embodiment

Figure 8:
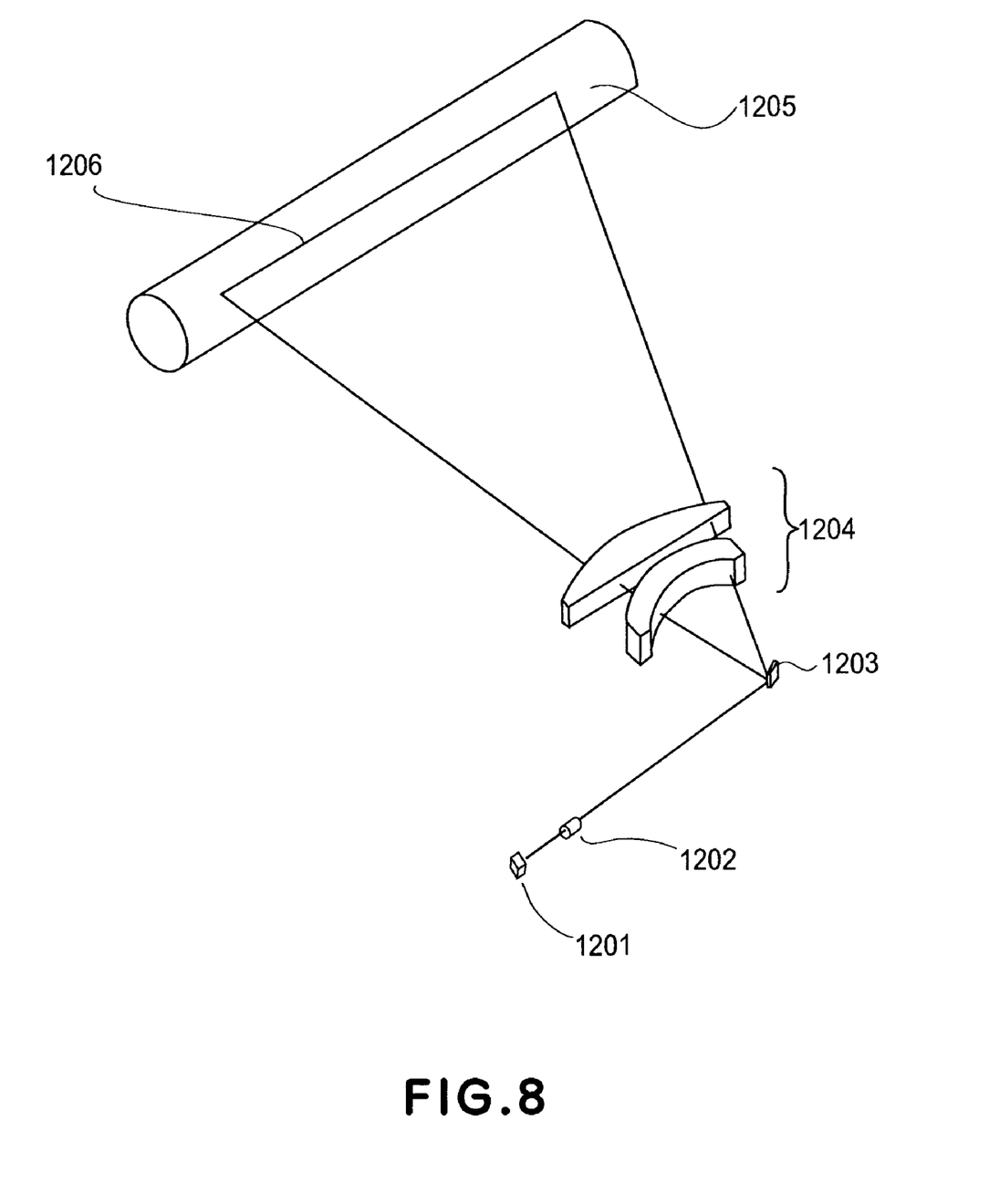
FIG. 8 is a perspective view for explaining an image forming apparatus according to an eighth embodiment of the present invention which comprises an optical deflector of the present invention.

Referring to FIG. 8, an eighth embodiment of the present invention will be explained. FIG. 8 is a perspective view illustrating an embodiment of optical equipment using an optical deflector as described hereinbefore. Here, an image forming apparatus is shown as an example of the optical equipment.

In FIG. 8, denoted at 1203 is an optical deflector of the present invention. In this embodiment, it is configured to scan the light incident thereon, one-dimensionally. Denoted at 1201 is a laser source, and denoted at 1202 is a lens or lens group. Denoted at 1204 is a writing lens or lens group which is an imaging optical system. Denoted at 1205 is a photosensitive member which corresponds to a surface to be irradiated with light. Denoted at 1206 is the locus of scan. A laser beam emitted from the laser source 1201 receives predetermined intensity modulation related to the timing of scanningly deflection of the light, and it is scanned by the optical deflector 1203 one-dimensionally.

The scanned laser beam forms an image on the photosensitive member 1205, through the writing lens 1204. The photosensitive member 1205 is uniformly charged by a charging device, not shown. By scanning the surface thereof with light, an electrostatic latent image is produced on that portion. Subsequently, a toner image is produced on the image portion of the electrostatic latent image, by means of a developing device, not shown. Then, the toner image is transferred to a paper sheet, not shown, for example, and fixed thereon, whereby an image is produced.

In accordance with the present embodiment, an image forming apparatus can be accomplished at a relatively low cost by using a low-cost, small-size and high-performance optical deflector.

The invention claimed is:

1. An oscillating device, comprising:
an oscillator;
an elastic supporting member for movably supporting said oscillator, said elastic supporting member and said oscillator being connected to each other;
a first supporting frame for supporting said elastic supporting member, said first supporting frame and said elastic supporting member being connected to each other;
a second supporting frame extending along said elastic supporting member with a spacing maintained therebetween, said second supporting frame extending from said first supporting frame;
a fixing member for fixing said first supporting frame and said second supporting frame, said first supporting frame and said second supporting frame being connected to said fixing member;
wherein one end of said second supporting frame is connected with said first supporting frame and the other end of said second supporting frame is not connected with said first supporting frame, and said first supporting frame and said second supporting frame are fixed to said fixing member in a common plane.

2. An oscillating device according to claim 1, wherein said oscillating device comprises a plurality of said second supporting frames which are provided while sandwiching said elastic supporting member therebetween.

3. An oscillating device according to claim 1, wherein said second supporting frame extends along said elastic supporting member and said oscillator with a spacing maintained therebetween.

4. An oscillating device according to claim 1, wherein a length of said second supporting frame is equal to or shorter than a combined length of said oscillator and said elastic supporting member.

5. An oscillating device according to claim 1, wherein one of edges of said second supporting frame which is parallel to the elongation direction of said elastic supporting member and which is remote from said elastic supporting member, is disposed on the same line as an edge of said oscillator being parallel to the elongation direction of said elastic supporting member, or is disposed at one side of the edge of the oscillator being parallel to the elongation direction of said elastic supporting member which side is closer to said elastic supporting member.

6. An oscillating device according to claim 1, wherein said oscillating device has a centroid which is located within a region of said first supporting frame or a region sandwiched by a plurality of said second supporting frames.

7. An oscillating device according to claim 1, wherein said oscillator is provided with a mirror for deflecting light incident thereon.

8. An optical deflector, comprising:
an oscillating device as recited in claim 7;
an actuator for oscillating said oscillator of said oscillating device by using at least one of an electromagnetic force, an electrostatic attraction force and a deformation force.

9. An optical instrument, comprising:
a light source;
an imaging optical system; and
an optical deflector as recited in claim 8,
wherein said optical instrument is arranged such that (1) said light source directs light at said optical deflectors; (2) said optical deflector deflects the light from said light source to said imaging optical system, and (3) the deflected light is incident on a surface to be irradiated, through said imaging optical system.

10. A method of fixing an oscillating device as recited in claim 1, on a fixing member, characterized in that, after the first and second supporting frames are held fixed on the fixing member, at least a portion of the second supporting frame is separated and removed.

* * * * *